US009502255B2

(12) United States Patent
Antonelli et al.

(10) Patent No.: US 9,502,255 B2
(45) Date of Patent: Nov. 22, 2016

(54) LOW-K DAMAGE REPAIR AND PORE SEALING AGENTS WITH PHOTOSENSITIVE END GROUPS

(71) Applicant: Lam Research Corporation, Fremont, CA (US)

(72) Inventors: George Andrew Antonelli, Portland, OR (US); Andrew John McKerrow, Lake Oswego, OR (US)

(73) Assignee: Lam Research Corporation, Fremont, CA (US)

( * ) Notice: Subject to any disclaimer, the term of this patent is extended or adjusted under 35 U.S.C. 154(b) by 29 days.

(21) Appl. No.: 14/517,732

(22) Filed: Oct. 17, 2014

(65) Prior Publication Data

US 2016/0111288 A1   Apr. 21, 2016

(51) Int. Cl.
*H01L 21/268*   (2006.01)
*H01L 21/3105*   (2006.01)
*H01L 21/67*   (2006.01)

(52) U.S. Cl.
CPC ....... *H01L 21/2686* (2013.01); *H01L 21/3105* (2013.01); *H01L 21/67115* (2013.01)

(58) Field of Classification Search
CPC ................ H01L 21/7682; H01L 21/02126; H01L 21/02203; H01L 21/76808; H01L 21/02216; H01L 21/31058; H01L 21/76825; H01L 21/76826; H01L 23/5329; H01L 21/02271; H01L 21/02274; H01L 21/02351; H01L 21/312; H01L 21/3122; H01L 21/3124; H01L 21/764
USPC .................................................. 438/689, 622
See application file for complete search history.

(56) References Cited

U.S. PATENT DOCUMENTS

| | | |
|---|---|---|
| 6,333,268 B1 | 12/2001 | Starov et al. |
| 7,033,945 B2 | 4/2006 | Byun et al. |
| 7,094,713 B1 | 8/2006 | Niu et al. |
| 7,166,531 B1 | 1/2007 | Van den Hoek et al. |
| 7,195,548 B1 | 3/2007 | Hardikar et al. |
| 7,629,227 B1 | 12/2009 | Wang et al. |
| 7,648,927 B2 | 1/2010 | Singh et al. |
| 7,851,232 B2 | 12/2010 | van Schravendijk et al. |

(Continued)

FOREIGN PATENT DOCUMENTS

| | | |
|---|---|---|
| CN | 1531749 A | 9/2004 |
| CN | 1624895 A | 6/2005 |

(Continued)

OTHER PUBLICATIONS

U.S. Office Action dated Apr. 6, 2009 issued in U.S. Appl. No. 11/590,661.

(Continued)

*Primary Examiner* — Caleen Sullivan
(74) *Attorney, Agent, or Firm* — Weaver Austin Villeneuve & Sampson LLP

(57) ABSTRACT

Methods of repairing damaged low-k dielectric films using UV-activated photosensitive organic compounds are described herein. Methods of sealing pores by exposing porous dielectric films to UV-activated large photosensitive organic compounds are also described. Methods also include mechanically reinforcing dielectric films using photosensitive organic compounds activated by UV radiation. Compounds include at least one photosensitive end group, such as an unsaturated bond or group with high ring strain.

16 Claims, 9 Drawing Sheets

(56) References Cited

U.S. PATENT DOCUMENTS

| | | |
|---|---|---|
| 7,858,533 B2 | 12/2010 | Liu et al. |
| 7,999,356 B2 | 8/2011 | Nakasaki et al. |
| 8,178,159 B2 | 5/2012 | Baikerikar et al. |
| 8,535,767 B1 | 9/2013 | Kimura |
| 9,245,739 B2 | 1/2016 | Ndiege et al. |
| 2004/0115933 A1 | 6/2004 | Jung et al. |
| 2005/0020074 A1 | 1/2005 | Kloster et al. |
| 2005/0064712 A1 | 3/2005 | Andreas |
| 2005/0208758 A1 | 9/2005 | Lu et al. |
| 2005/0258542 A1 | 11/2005 | Fuller et al. |
| 2006/0024976 A1 | 2/2006 | Waldfried et al. |
| 2006/0046516 A1 | 3/2006 | Weber |
| 2006/0172531 A1 | 8/2006 | Lin et al. |
| 2006/0189133 A1 | 8/2006 | Dimitrakopoulos et al. |
| 2007/0161230 A1 | 7/2007 | Chen et al. |
| 2007/0222081 A1 | 9/2007 | Chen et al. |
| 2007/0224824 A1 | 9/2007 | Chen et al. |
| 2007/0228570 A1 | 10/2007 | Dimitrakopoulos et al. |
| 2008/0026579 A1 | 1/2008 | Lai et al. |
| 2008/0054466 A1 | 3/2008 | Nasu et al. |
| 2008/0113178 A1* | 5/2008 | Lazovsky ............. B82Y 30/00 428/304.4 |
| 2008/0199977 A1 | 8/2008 | Weigel et al. |
| 2008/0242118 A1 | 10/2008 | Dimitrakopoulos et al. |
| 2009/0243001 A1 | 10/2009 | Ramkumar et al. |
| 2009/0269507 A1 | 10/2009 | Yu et al. |
| 2010/0018460 A1 | 1/2010 | Singh et al. |
| 2010/0261349 A1 | 10/2010 | Van Schravendijk et al. |
| 2010/0317198 A1 | 12/2010 | Antonelli et al. |
| 2011/0020955 A1 | 1/2011 | DeYoung |
| 2011/0045610 A1 | 2/2011 | Van Schravendijk et al. |
| 2011/0111533 A1 | 5/2011 | Varadarajan et al. |
| 2014/0004717 A1 | 1/2014 | Chan et al. |
| 2014/0150647 A1 | 6/2014 | Ahn et al. |
| 2015/0004806 A1 | 1/2015 | Ndiege et al. |
| 2016/0056071 A1 | 2/2016 | Draeger et al. |

FOREIGN PATENT DOCUMENTS

| | | |
|---|---|---|
| CN | 101005023 A | 7/2007 |
| CN | 102074500 | 5/2011 |
| KR | 10-1201039 | 11/2012 |
| TW | 201130045 | 9/2011 |
| WO | WO 2008/156608 | 12/2008 |

OTHER PUBLICATIONS

U.S. Final Office Action dated Jan. 25, 2010 issued in U.S. Appl. No. 11/590,661.
U.S. Notice of Allowance dated Aug. 6, 2010 issued in U.S. Appl. No. 11/590,661.
U.S. Office Action dated Dec. 13, 2011 issued in U.S. Appl. No. 12/940,324.
U.S. Office Action dated Jul. 15, 2011 issued in U.S. Appl. No. 12/646,830.
U.S. Office Action dated Jan. 11, 2012 issued in U.S. Appl. No. 12/646,830.
U.S. Final Office Action dated May 25, 2012 issued in U.S. Appl. No. 12/646,830.
U.S. Office Action dated Mar. 6, 2013 issued in U.S. Appl. No. 12/646,830.
U.S. Final Office Action dated Jul. 30, 2013 issued in U.S. Appl. No. 12/646,830.
U.S. Office Action dated Feb. 20, 2014 issued in U.S. Appl. No. 12/646,830.
U.S. Final Office Action dated Sep. 12, 2014 issued in U.S. Appl. No. 12/646,830.
U.S. Office Action dated Sep. 3, 2015 issued in U.S. Appl. No. 12/646,830.
Chinese First Office Action dated Jan. 14, 2013 issued in Appl. No. 201010539625.7.
Chinese Second Office Action dated Sep. 10, 2013 issued in Appl. No. 201010539625.7.
Chinese Third Office Action dated May 23, 2014 issued in Appl. No. 201010539625.7.
Chinese Fourth Office Action dated Mar. 24, 2015 issued in Appl. No. 201010539625.7.
Korean Notification of Provisional Rejection dated Jul. 12, 2011 issued in Appl. No. 10-2010-0066153.
Korean Notification of Provisional Rejection dated Mar. 26, 2012 issued in Appl. No. 10-2010-0066153.
SG Examination Report dated Apr. 25, 2012 issued in Application No. 2010079747.
Taiwan Office Action dated Mar. 27, 2013 issued in Application No. 099123184.
Grill et al. (Nov. 15, 2003) "Structure of low dielectric constant to extreme low dielectric constant SiCOH films: Fourier transform infrared spectroscopy characterization," *Journal of Applied Physics*, 94(10):6697-6707.
US Office Action, dated Mar. 25, 2015, issued in U.S. Appl. No. 14/464,196.
US Notice of Allowance, dated Sep. 14, 2015, issued in U.S. Appl. No. 14/464,196.
Bekiari, V. et al. (1998) "Characterization of Photoluminescence from a Material Made by Interaction of (3-Aminopropyl)triethoxysilane with Acetic Acid," *Langmuir*, 14(13):3459-3461.
Brankova et al. (2003) "Photoluminescence from Sol-Gel Organic/Inorganic Hybrid Gels Obtained through Carboxylic Acid Solvolysis," *Chem. Mater.*, 15(9):1855-1859.
Fessenden et al. (1961) "The Chemistry of Silicon-Nitrogen Compounds," *Chem. Rev.* 61(4)361-388.
Kessler et al. (2006) "New insight in the role of modifying ligands in the sol-gel processing of metal alkoxide precursors: a possibility to approach new classes of materials," *J. Sol-Gel Sci. Techn.* 40(2-3):163-179.
Stathatos et al. (Jul. 19, 2003) "Study of Acetic Acid-Catalyzed Nanocomposite Organic/Inorganic Ureasil Sol-Gel Ionic Conductors," *Langmuir*, 19:(18)7587-7591.
U.S. Appl. No. 14/464,071, filed Aug. 20, 2014, entitled "Flowable Dielectric for Selective Ultra Low-K Pore Sealing."
U.S. Final Office Action dated Feb. 2, 2016 issued in U.S. Appl. No. 12/646,830.
Chinese Fifth Office Action dated Oct. 19, 2015 issued in Application No. CN 201010539625.7.
Chinese Sixth Office Action dated Mar. 17, 2016 issued in Application No. CN 201010539625.7.
US Office Action, dated Dec. 30, 2015, issued in U.S. Appl. No. 14/464,071.

* cited by examiner

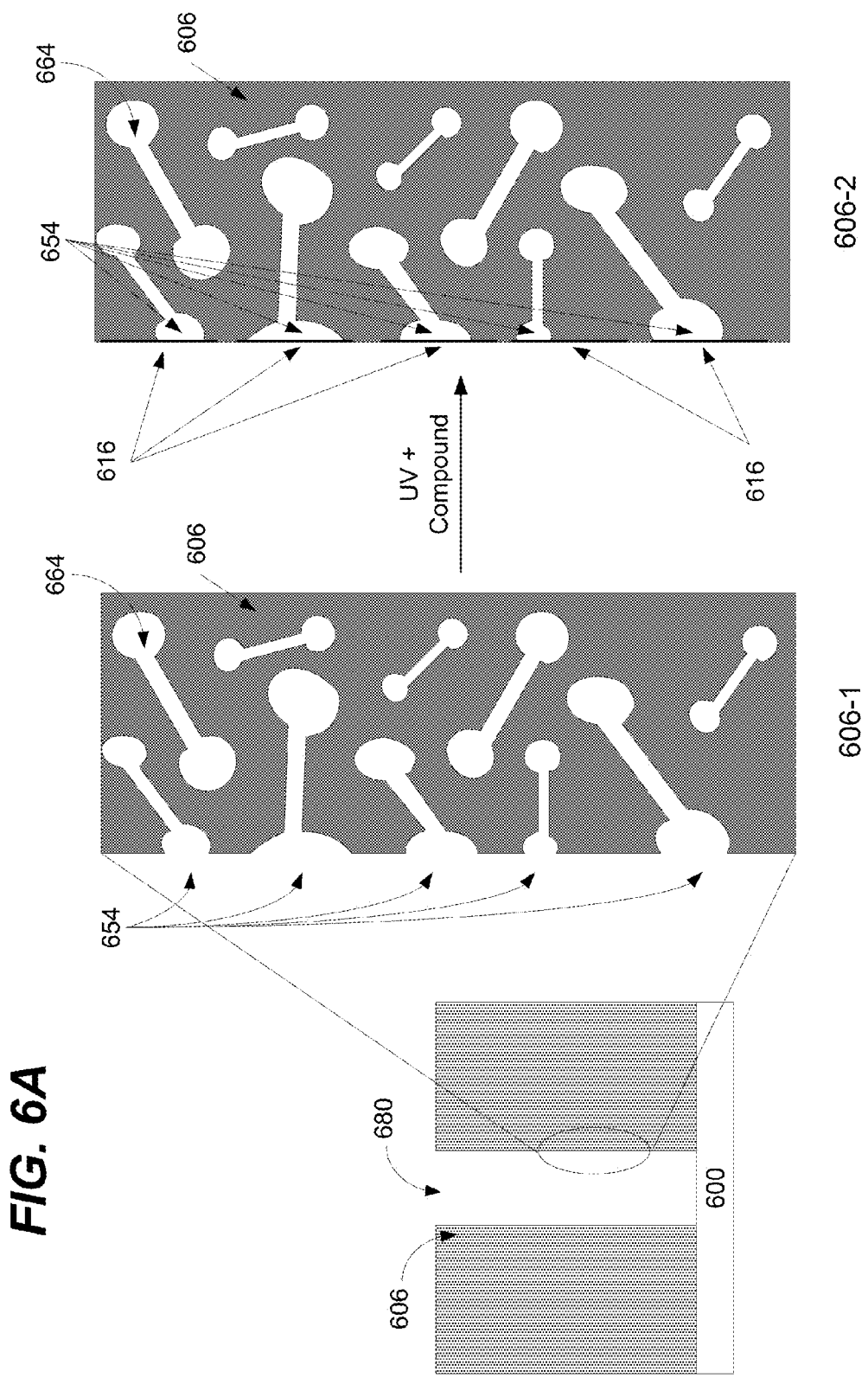

LOW-K DAMAGE REPAIR AND PORE SEALING AGENTS WITH PHOTOSENSITIVE END GROUPS

BACKGROUND

As integrated circuits (IC) feature sizes shrink, problems of increased resistance and resistance-capacitance (RC) coupling offset the speed advantage derived from the smaller device size, limiting improvement in device performance. Ways to improve device performance and reliability include using highly conductive metals, such as copper, and employing lower dielectric constant (low-k) materials. Low-k materials are semiconductor-grade insulating materials that have a dielectric constant ("κ" or "k" as used herein) lower than that of silicon dioxide ($SiO_2$), i.e., 3.9. With more and more advanced technology needs, ultra low-k dielectric (ULK) materials having a k less than 2.5 are used. ULK dielectrics can be obtained by incorporating or creating voids within a low-k dielectric, creating a porous dielectric material. Applications of ULK dielectrics include back end of line (BEOL) interlayer dielectrics (ILDs).

SUMMARY

Methods of repairing low-k dielectric substrates and sealing pores are provided herein. One aspect includes a method of sealing pores in a low-k dielectric substrate by exposing a photosensitive organic compound to ultraviolet radiation to form an activated species, and exposing the substrate to the activated species to thereby seal pores, such that the diameter of the photosensitive organic compound is greater than about 1 nm. In some embodiments, the method further includes exposing the substrate to the photosensitive organic compound prior to exposing the photosensitive organic compound to ultraviolet radiation. In various embodiments, the large photosensitive organic compound is exposed to the UV radiation in a chamber that houses the low-k dielectric substrate.

The diameter of the organic compound may be greater than about 1.5 nm. In some embodiments, the diameter of the organic compound may be greater than about 2 nm. In various embodiments, the diameter of the organic compound is greater than the effective pore diameter of the low-k dielectric. The organic compound may be activated at a wavelength greater than about 200 nm.

In some embodiments, the organic compound has at least two photosensitive groups. The photosensitive groups may be selected from the group consisting of alkenes, alkynes, aryls, alcohols, alkoxides, and cyclic structures. In some embodiments, the substrate is exposed to the activated species at a temperature of between about 25° C. to about 450° C.

Another aspect includes a method of mechanically reinforcing a low-k dielectric substrate by exposing a photosensitive organic compound to ultraviolet radiation to form an activated species, and exposing the substrate to the activated species, such the organic compound includes at least two photosensitive groups, and exposing the substrate to the activated species increases silicon-oxide cross linking in the dielectric substrate. In some embodiments, the photosensitive organic compound may be activated at a wavelength greater than about 200 nm.

The photosensitive groups may be selected from the group consisting of alkenes, alkynes, aryls, alcohols, alkoxides, and cyclic structures. In some embodiments, the photosensitive organic compound further includes at least two silicon atoms. In some embodiments, the photosensitive organic compound has a diameter less than an effective pore diameter of the low-k dielectric.

Another aspect includes a method of repairing damage in a low-k dielectric substrate by exposing a photosensitive organic compound to ultraviolet radiation to form an activated species, and exposing the substrate to the activated species, such that the photosensitive organic compound is selected from the group consisting of non-vinyl aryls, non-aromatic cyclic structures, and alcohols, and low-k dielectric damage in the substrate is repaired. The method may also include exposing the substrate to the photosensitive organic compound prior to exposing the photosensitive organic compound to ultraviolet radiation.

In various embodiments, the photosensitive organic compound is an alcohol formed by reacting an organosilane with a reducing agent via a hydrolysis mechanism. In some embodiments, the photosensitive organic compound is an alcohol formed by reacting an alkoxysilane with a reducing agent via a hydrolysis mechanism.

Another aspect includes an apparatus for processing semiconductor substrates including at least one process chamber including a pedestal for holding a substrate; at least one outlet for coupling to a vacuum; one or more process gas inlets coupled to one or more photosensitive organic compound sources; an ultraviolet radiation source; and a controller for controlling operations in the apparatus, which includes machine-readable instructions for: introducing the one or more photosensitive organic compound to the ultraviolet radiation source to form an activated species, and introducing the activated species to the process chamber, such that the substrate comprises a low-k dielectric film, and the photosensitive organic compound includes a photosensitive end group.

In some embodiments, the apparatus includes another process chamber for forming the one or more organic compound sources to be coupled to the one or more process gas inlets. In various embodiments, the controller further includes instructions for sequentially exposing the one or more organic compound sources to the ultraviolet radiation source.

These and other aspects are described further below with reference to the drawings.

BRIEF DESCRIPTION OF THE DRAWINGS

FIG. 6A is a schematic diagram of an example of a porous dielectric film before and after pore sealing in accordance with disclosed embodiments.

DETAILED DESCRIPTION

Figure 1:
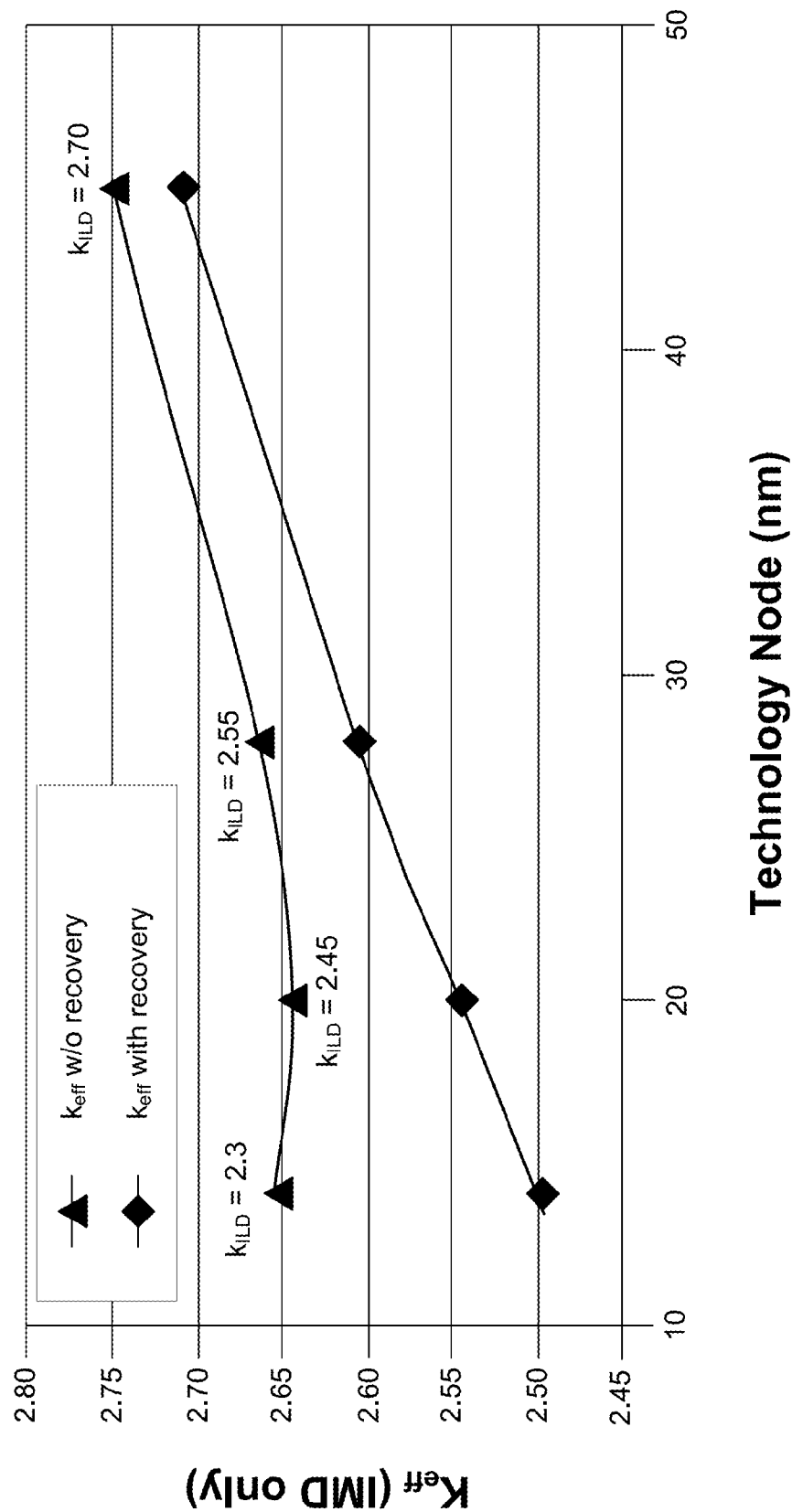
FIG. 1 is a graph depicting correlations between dielectric constants and technology nodes for dielectric films without and with k recovery.

In the following description, numerous specific details are set forth to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

The term "semiconductor device" as used herein refers to any device formed on a semiconductor substrate or any device possessing a semiconductor material. In many cases, a semiconductor device participates in electronic logic or memory, or in energy conversion. The term "semiconductor device" subsumes partially fabricated devices (such as partially fabricated integrated circuits) as well as completed devices available for sale or installed in a particular apparatus. In short, a semiconductor device may exist at any state of manufacture that employs a method of the subject matter disclosed herein or possesses a structure of this subject matter disclosed herein.

A semiconductor substrate as described herein may be a dielectric substrate, which may include a porous dielectric film. The porous dielectric film may be for example, an ultra low-k (ULK) film, having a dielectric constant k between 2.2 and 2.7. Examples of ULK films include carbon doped oxide (CDO) films, zeolite films, and polymer films. In some embodiments, the film may be an extreme low-k (ELK) film, having a dielectric constant less than 2.2. ULK and ELK thin films may be porous by design to lower the dielectric constant. However, these films are also fragile and may be easily damaged by the deposition, etch, and clean processes for the fabrication of semiconductor devices.

The porosity of the dielectric film may be connected, and pores may be introduced by removal of a porogen from a dielectric matrix, while some pores may be inherent to the dielectric matrix. For example, a CDO matrix may have porosity due to the incorporation of methyl or other organic groups. The porous dielectric film may include mesoporosity and/or microporosity. Mesoporosity generally refers to pore sizes of about 2 nm to about 50 nm and microporosity to pore sizes less than about 2 nm in diameter. In dielectrics having connected porosity, the size of at least some of the connected pores may be on a continuum with micropores having sizes on the order of Angstroms to nanometers, connected to mesopores having sizes on the order of nanometers to tens of nanometers.

Because a dielectric film may include pores of different sizes and shapes, it may be characterized in terms of an effective pore diameter. As used herein, the term "effective pore diameter" is defined as the maximum diameter of a porogen that can pass through a pore in a dielectric film. In some embodiments, the effective pore diameter is the maximum diameter of the largest pore in a dielectric film.

The techniques disclosed herein relate to the use of agents having photosensitive end groups in treating porous dielectric films. According to various implementations, the treatments may include one or more of k-recovery of porous dielectric films, pore sealing of porous dielectric films, and mechanical strengthening of porous dielectric films. These are discussed further below.

High porosity in low-k dielectric films may make the films more susceptible to damage. These films may be damaged by various processes in the fabrication of semiconductor devices, such as exposure to plasmas or other chemicals during etching and deposition processes. Examples of processes that may cause damage include etching, wet cleaning, air exposure, chemical mechanical planarization (CMP), electroplating, dry cleaning, ashing, removing hard masks, and patterning. In some applications, damage to a low-k dielectric material on the sidewalls of the via trenches or in the inter-layer dielectric (ILD) regions during, for example, copper (Cu) damascene processing can compromise the integrity of dielectric spacing, leading to increased leakage, higher capacitance, and reduced performance and reliability. The damaged low-k films can absorb moisture which remains trapped in the dielectric. This can oxidize the barrier material leading to Cu diffusion. Thus, dielectric repair to prevent the unwanted absorption of moisture may be desired. Damaged films may have a higher dielectric constant after exposure to various chemistries used in semiconductor processing. Repairing a damaged dielectric film may be referred to as "k recovery," meaning to recover the dielectric constant k of the original dielectric film prior to damage (or "pre-damage" as used herein). It may be of particular note to repair damaged films having smaller node features since damage in such a film may have more pronounced effects on the effectiveness and consistency of the semiconductor device. This correlation is depicted in FIG. 1.

FIG. 1 provides a plot showing an approximate correlation between the technology node of a film and the effective dielectric constant for an inter-metal low-k dielectric layer. In FIG. 1, four inter-metal dielectric (IMD) films were evaluated by numerical simulation. Each film corresponded to a specific technology node 12 nm, 20 nm, 28 nm, and 45 nm, with the dielectric constant in each film was 2.3, 2.45, 2.55, and 2.70 respectively. The impact of process-induced damage on the end of line dielectric constant (referred to as the effective dielectric constant) was determined using a model. The model calculates the effective dielectric constant, or predicted dielectric constant, by considering the dimensions of the pattern, the bulk dielectric constant, and characteristics of the damaged layer. The damage depth on each film was set at 6 nm, and the damaged portion of the film had a dielectric constant of k=3.0.

The effective dielectric constant for the films post damage is plotted in FIG. 1. The triangular data points show the dielectric constants for unrepaired dielectric films without k recovery, while the diamond data points show the dielectric constants of those same films after k recovery. As shown by the lines connecting the points, as technology nodes decrease, the effect of not recovering the dielectric constant k for dielectric films becomes more pronounced, with the difference in dielectric constant between an unrepaired and a repaired film becoming larger. For example, for a technology node of 20 nm, a dielectric film with an original dielectric constant k of 2.45 may have a dielectric constant k of almost 2.65 post-damage, and k recovery helps reduce the dielectric constant k to about 2.55, with the difference between a repaired and unrepaired film being 0.1. In comparison, k-recovery of a film with a technology node of 45 nm results in a difference of only about 0.05 in dielectric constant. Process-induced damage on semiconductor substrates having a logic node below about 20 nm may have a more significant impact to performance than at higher technology nodes. Thus, repair of damaged low-k integrated materials is of particular interest for nodes below about 20 nm.

A damaged dielectric film may include dangling bonds, such as unbonded silicon atoms, as well as Si—H bonds. A dangling bond may occur, for example, when a Si—CH$_3$ bond is broken. In some cases, these dangling bonds may form highly polarizable silanol (Si—OH) groups on the surface of the damaged film when the film is oxidized. An example reaction mechanism for the oxidation of a dangling organic group bonded to an organic-silicon matrix of a dielectric film is shown in Reactions 1A and 1B. In Reaction 1A, a Si—CH$_3$ bond on the surface of the dielectric film is exposed to an ion to yield damaged silicon dangling bond. In reaction 1B, the film is exposed to water, which oxidizes the film and forms silanol bonds on the surface of the dielectric film. These dangling bonds and silanol groups increase the dielectric constant.

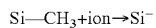

Si—CH$_3$+ion→Si$^-$              Rxn. 1A

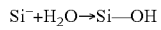

Si$^-$+H$_2$O→Si—OH              Rxn. 1B

Provided herein are methods of repairing dielectric films, sealing pores, and mechanically reinforcing dielectric films using ultraviolet (UV) radiation and photosensitive organic compounds. Without being bound by a particular theory, UV radiation activates a photosensitive group on the photosensitive compound to drive reactions that consume chemisorbed water as well as condensation reactions of Si—OH groups. In some embodiments, the photosensitive group is used as a silylation agent or a methylation agent. The photosensitive group may be decomposed and activated by exposure to UV radiation. Repair processes described herein may include both a silylation or methylation and an UV light component. Pore sealing processes may be performed using large photosensitive organic compounds, which are at least bifunctional. Dielectric films are processed by methods described herein to mechanically reinforce the matrix using bifunctional or multifunctional photosensitive organic compounds of various sizes. The size of the molecule can be used to select between repair, pore sealing, and mechanical reinforcement processes.

Example compounds for use in accordance with disclosed embodiments may include silicon bonded to photosensitive groups with unsaturated bonds or groups with high ring strain. Example groups include ethenyls, allyls, crotyls, ethynyls, propargyls, propynyls, aryls, cyclic substituents, heterocyclic substituents, and combinations thereof. An example of an ethenyl group is a vinyl group (CH$_2$=CH—R). Acetylene (HC≡CH) is an example of an ethynyl group.

Aryls include phenyls, phenylenes, benzyls, and other aromatic groups. Example aryls include styrene and naphthalene.

Cyclic structures include silicon-containing compounds bonded to cycloalkanes, cycloalkenes and/or heterocyclic structures. Cycloalkanes have the chemical formula $C_nH_{2(n+1-g)}$ where n is the number of carbon atoms and g is the number of rings in the molecule. Examples include cyclopropane, cyclobutane, cyclopentane, and cyclohexane. Cycloalkenes having one double bond have the chemical formula $C_nH_{(2n-2)}$ where n is the number of carbon atoms. Example cycloalkenes include cyclopropene, cyclobutene, cyclopentene, cyclohexene, cycloheptene, 1,3-cyclohexadiene, 1,4-cyclohexadiene, and 1,5-cyclooctadiene. Example heterocyclic substituents include furan, pyran, dioxane, and cyclic ethers such as epoxy, oxetane, oxolane, and oxirane.

Some compounds may include a silicon atom for a silylation reaction. In some embodiments, compounds may include purely organic compounds without silicon, for use as methylation agents.

Example compounds for use with other disclosed embodiments may include silanols formed from organosilicon compounds.

The photosensitive compounds described herein may be activated by UV radiation at various wavelengths. Compounds may be activated at wavelengths greater than about 200 nm such that carbon is not removed from the dielectric film. In some embodiments, the compounds are activated at a wavelength greater than about 180 nm. The wavelength of the UV radiation may be tailored to the particular photosensitive organic compound used or the particular dielectric film to be repaired. Since the photosensitive organic compounds do not include a halide or an amine group, the compounds are unlikely to react with other parts of a semiconductor device.

The disclosed embodiments may be performed at various conditions. The low-k dielectric film may be processed at a temperature between about 25° C. and about 450° C., or between about 250° C. and about 400° C. Process temperature may depend on the photosensitive organic compound used, process conditions (e.g., pressure and flow), and the mechanism desired for a selected compound. For example, in some embodiments, temperature may be higher to allow some compounds to undergo a certain mechanism. The processes may be performed in a chamber at a pressure between about 0.5 Torr and about 20 Torr, in the presence of an inert carrier gas, such as a noble gas (helium, argon, or others), or nitrogen. The low-k dielectric substrate may be exposed in one or more exposures, with each exposure flowing about 1 mg/cm$^2$ to about 100 mg/cm$^2$ of the photosensitive organic compound.

Figure 2:
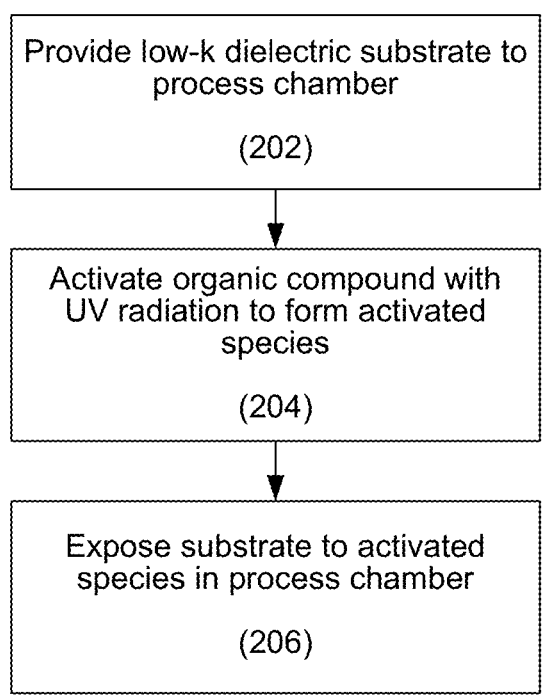
FIGS. 2, 3A, and 3B are process flow diagrams depicting operations for performing methods in accordance with disclosed embodiments.

The low-k dielectric film may be exposed to the photosensitive organic compound simultaneously with a UV source. FIG. 2 is a process flow diagram depicting operations in accordance with a method described herein. In operation 202, a low-k dielectric substrate is provided to a process chamber. The low-k dielectric substrate may be an ULK film, or an ELK film, for example. The film may include various locations on the surface and within the dielectric film that may be repaired, or may include pores to be sealed, or may be highly porous.

In operation 204, the photosensitive organic compound is activated with UV radiation to form an activated species. In some embodiments, the activated species is less stable than its inactive form. Without being bound by a particular theory, the UV radiation may excite the photosensitive organic compound such that a photosensitive group on the compound is more susceptible to leaving the compound as a leaving group. In some embodiments, the UV radiation breaks the compound down, thereby activating it. The activated species may then be adhered to the substrate. For example, a photosensitive organic compound that is more adsorbing and is more reactive for photolysis products may undergo UV activation prior to reacting with the substrate. The process described with respect to FIG. 2 is an example of a mechanism whereby the compound is activated by UV radiation prior to substrate exposure to the activated species.

In some embodiments, one or more initiators are used with the compound. The initiator may be added during UV activation such that both the compound and the initiator are activated in operation 204. In some embodiments, the initiator may be added in a different operation. Example initiators include ammonia (NH$_3$), carbon dioxide (CO$_2$), and other photosensitive organic compounds as described below. In various embodiments, the initiator has a greater UV sensitivity than the compound being activated such that the initiator and compound may react upon exposure to UV radiation. For example, a photosensitive organic compound that has a lower reactivity or is less susceptible to reacting with a substrate surface than other photosensitive organic compounds may be used in conjunction with an initiator.

In various embodiments, the activation is performed in the process chamber such that the photosensitive organic compound is flowed in gas phase into the process chamber and a UV radiation source, such as a UV light, in the chamber is turned on to activate the photosensitive organic compound. In some embodiments, flow of the photosensitive organic compound to the chamber and the UV source are turned on at the same time or simultaneously. In some embodiments, and without being bound by a particular theory, a photosensitive organic compound including at least one double bond or triple bond is converted to a single bond to form the activated species. In some embodiments, a mixture of two or more photosensitive organic compounds is activated with UV radiation to form the activated species.

In some embodiments, the activation is performed upstream of the process chamber. A remote process chamber may include a UV radiation source, and the photosensitive organic compound may be activated in the remote chamber by flowing the photosensitive organic compound to the remote chamber, turning on the UV radiation source in the remote chamber, and exposing the compound to the UV radiation to form an activated species, which is subsequently introduced to the process chamber via an inlet or showerhead. The transfer of the activated species from the remote chamber to the process chamber may occur in a vacuum. In some embodiments, transit time of the activated species from a remote chamber to the process chamber is minimized to mitigate recombination.

The UV radiation source may emit UV radiation at a wavelength between about 180 nm and about 250 nm, or greater than about 250 nm. The UV exposure may be conducted in vacuum. Exposure time may be limited in order to prevent oxidation of or the stripping of carbons from the dielectric. In general, the dose time may be between about 10 seconds and about 30 minutes, or between about 1 minute and 5 minutes. The choices of UV wavelength(s), total exposure time and intensity, etc., depend on a number of factors, including the thickness of the dielectric film and the composition of the dielectric film. Suitable UV treatment parameters are in the power intensity range measured in power per wafer surface area of about 1 mW/cm$^2$ to about 20 W/cm$^2$, or about 500 mW/cm$^2$ to about 5 W/cm$^2$; at a wavelength of about 150 nm to about 500 nm, preferably about 200 nm to about 400 nm; for up to about 20 minutes, for example less than 10 minutes, or less than 5 minutes, or less than about 2 minutes. A typical UV exposure in accordance with disclosed embodiments may have a power density of about 1-3 W/cm$^2$ at a wafer temperature of about 350° C. in either inert (e.g., He, Ar, forming gas, or N$_2$). The UV source can be a single wavelength excimer lamp or broad spectrum source with arc or microwave excitations.

The apparatus employed to implement disclosed embodiments can have one or more UV sources. In some embodiments described herein, the apparatus will have a single UV source. In one particular implementation on a SOLA UV thermal processing system, available from Lam Research in Fremont, Calif., UV intensity can be anywhere between about 10% and about 100%. Lower intensity generally requires longer exposure times. The UV wavelength sources, temperature, and pressure can be as described above. Suitable apparatuses are described in more detail below with reference to FIG. 7.

In operation 206, the substrate is exposed to the activated species in the process chamber. Where the activated species is formed in the process chamber, the substrate may be exposed to the activated species while the photosensitive organic compound is activated by the UV radiation. Where the activated species is formed upstream of the process chamber, the activated species may be introduced to the process chamber where the substrate is housed.

Without being bound by a particular theory, the UV radiation may also chemisorb water where a thermal reaction occurs between two or more silanol terminals on the dielectric surface. An example reaction is provided in Reaction 2 below.

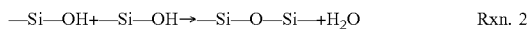

$$\text{—Si—OH} + \text{—Si—OH} \rightarrow \text{—Si—O—Si—} + H_2O \qquad \text{Rxn. 2}$$

UV radiation may eliminate H$_2$O from the reaction in Reaction 2 such that cross-linking is performed between silanol groups in the dielectric film.

The low-k dielectric film may be exposed to the photosensitive organic compound alone before exposure to a UV source, or the UV radiation source may be turned on before the photosensitive organic compound is introduced to the process chamber.

Figure 3A:
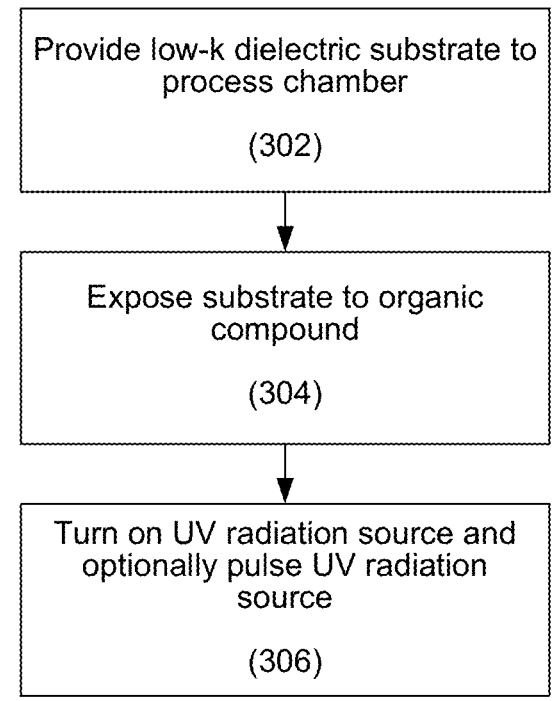
Figure 3B:
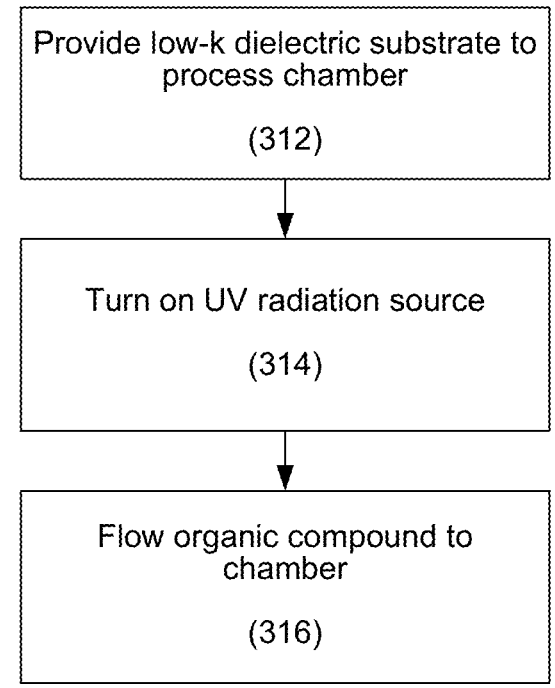

FIGS. 3A and 3B are process flow diagrams depicting operations in accordance with these embodiments. In FIG. 3A, a low-k dielectric substrate is provided to a process chamber in operation 302. In operation 304, the substrate is exposed to a photosensitive organic compound. Operation 304 may include flowing the photosensitive organic compound into the process chamber. In some embodiments, the photosensitive organic compound may be introduced to saturate the surface of the dielectric film prior to UV exposure. In some embodiments, the partial pressure of the chamber and pedestal temperature may be configured or set to condense the compound on the substrate during this operation.

In operation 306, the UV radiation source may be turned on. In some embodiments, the UV radiation source may be pulsed by turning the source on and off sequentially. The UV radiation source may be present in the process chamber, and the photosensitive organic compound may continue to flow into the chamber. In some embodiments, after the substrate is saturated with the photosensitive organic compound in operation 304, the substrate is transferred in a vacuum to a separate chamber for exposure to UV radiation in operation 306.

In some embodiments, the photosensitive organic compound exposure and UV radiation activation may be provided separately and/or sequentially in a mechanism where the compound condenses on the substrate prior to activation. For example, operations 304 and 306 may be repeated, such that when the substrate is exposed to the compound, the UV radiation is turned off, and when the UV radiation is turned on, the compound flow to the process chamber is turned off. A sequential process may be used for compounds that saturate the surface as well as compounds that may condense on the surface of the substrate.

In FIG. 3B, a low-k dielectric substrate is provided to a process chamber in operation 312. In operation 314, a UV radiation source may be turned on. For example, the UV radiation source may be present in the process chamber where the substrate is housed such that in operation 314, the substrate sits in a chamber in the presence of UV radiation. In operation 316, a photosensitive organic compound is introduced to the process chamber. As the compound is introduced to the chamber, the compound may be activated by the UV radiation to form an activated species that reacts with terminal groups on the dielectric substrate, thereby repairing the dielectric film, sealing pores, or mechanically reinforcing the matrix in the film. Each of these applications is described in further detail below.

Dielectric Film Repair and κ Recovery

Damaged low-k films may recover its pre-damage dielectric constant k by undergoing repair processes or k recovery. Damaged low-k films may include silanol (Si—OH) terminals, methyl (Si—CH$_3$) terminals, or dangling Si— bonds. Generally, suitable silicon-containing compounds for repairing low-k films may have the chemical formula:

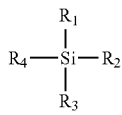

Each of R$_1$, R$_2$, R$_3$, and R$_4$ may be same or different carbon-containing groups. These R groups may include unsaturated organosilicons, such as those having triple-bonded carbons (alkynes) or double-bonded carbons such as vinyls and alkenes, aromatic rings, alcohols, and cyclic structures with high ring strain. In some embodiments, the photosensitive group may be a non-vinyl aryl structure, a non-aromatic cyclic structure, or an alcohol.

For example, R$_1$ may be an ethenyl, allyl, crotyl, ethynyl, propargyl, propynyl, aryl, cyclic substituent, or heterocyclic substituent. An example of an ethenyl group is a vinyl group (CH$_2$=CH—R). Acetylene is an example of an ethynyl group.

Specific example alkenes include allyltrimethylsilane, diallyldimethylsilane, dimethyldivinylsilane, and trimethyl(vinyl)silane, which are depicted below:

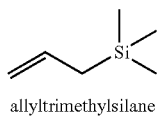 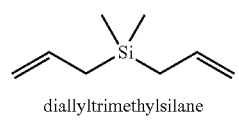
allyltrimethylsilane    diallyltrimethylsilane

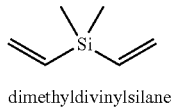 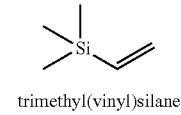
dimethyldivinylsilane   trimethyl(vinyl)silane

An example alkyne suitable for repairing low-k films is ethynyltrimethylsilane:

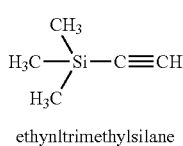
ethynltrimethylsilane

Non-aromatic cyclic structures are rings having at least one silicon and at least two carbons, with methyl groups (—CH$_3$) branching from each silicon atom on the compound. These compounds may have the general chemical formula: (CH$_2$)$_x$—Si$_y$(CH$_3$)$_{2y}$ where x is the number of other carbons in the ring (e.g., in a siletane, x is 3), and y is the number of silicons in the ring (e.g., in a disiletane, y is 2).

Suitable cyclic structures may include one silicon such as rings with one silicon and two carbon atoms (siliranes), one silicon and three carbon atoms (siletanes), one silicon and four carbons (silolanes), one silicon and five carbons (silinanes), one silicon and six carbons (silepanes), one silicon and seven carbons (silocanes). Other example silicon-containing cyclic structures include disiliranes, trisilolanes, and tetrasilolanes. Example cyclic structures with high ring strain include 1,1,3,3-tetramethyl-1,3-disiletane, 1,1-dimethylsiletane, and 1,1-dimethylsilinane:

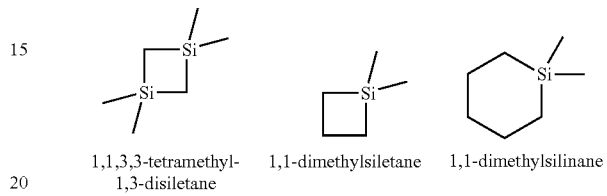

1,1,3,3-tetramethyl-    1,1-dimethylsiletane    1,1-dimethylsilinane
1,3-disiletane Aromatic rings or aryls include phenyls, phenylenes, benzyls, and other aromatic groups. In some embodiments, the silicon-containing compound is a non-vinyl aryl structure. Example silicon-containing aromatic structures include (1H-inden-1-yl)trimethylsilane, 1,4-bis(trimethylsilyl)benzene, 1,2-bis(trimethylsilyl)benzene, benzene-1,2,3-triyltris(trimethylsilane), benzyltrimethylsilane, dimethyldiphenylsilane, and trimethyl(phenyl)silane:

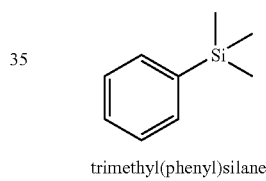
trimethyl(phenyl)silane

Siloxanes may also be activated by UV radiation to repair a damaged dielectric film. Siloxanes suitable for use in accordance with disclosed embodiments generally have unsaturated bonds and/or rings. Silicon centers in siloxanes are bonded to methyl groups (—CH$_3$) or vinyl groups (—CH=CH$_2$). Example siloxanes include tetravinyltetramethylcyclotetrasiloxane, vinyltris(trimethylsiloxy)silane, 1,1,2,2-tetramethyl-1,2-divinyldisilane, 1,3-divinyltetramethyldisiloxane, and tri-tert-butoxy(vinyl)silane:

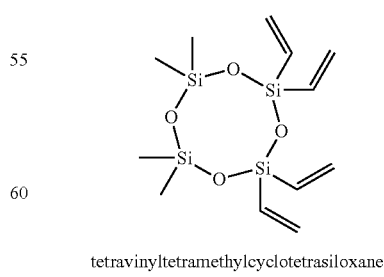
tetravinyltetramethylcyclotetrasiloxane

-continued

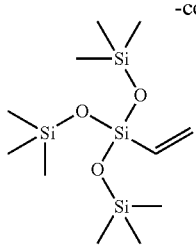

vinyltris(trimethylsiloxy)silane

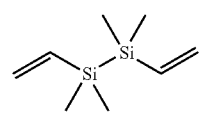

1,1,2,2-tetramethyl-1,2-divinyldisilane

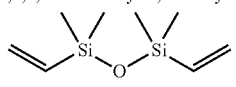

1,3-divinyltetramethyldisiloxane

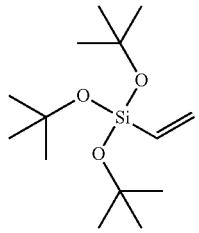

tri-tert-butoxy(vinyl)silane

Without being bound by any particular theory, the UV radiation activates a photosensitive group on the above described compounds, which increases the reactivity of the compound to react with terminal groups on the damaged dielectric film. These photosensitive groups may become leaving groups that are more unstable once activated, and therefore are more easily cleaved from the rest of the compound. In some embodiments, the photosensitive group, once activated, becomes a leaving group such that a silicon atom may form a bond with the damaged film. Unsaturated bonds and high ring strain in compounds are more easily destabilized by UV photons to react with the damaged dielectric film.

Figure 4:
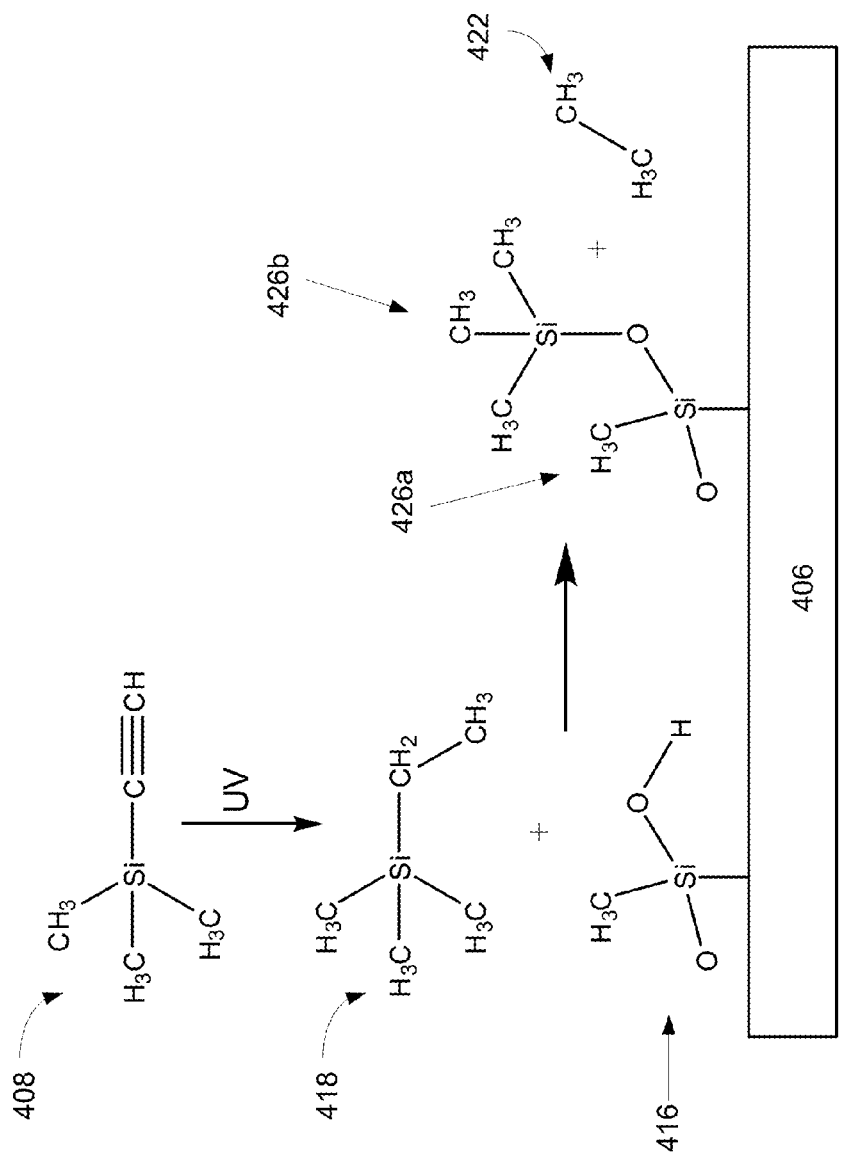
FIG. 4 is an example schematic diagram of a mechanism for repairing a dielectric film in accordance with disclosed embodiments.

FIG. 4 provides a schematic example of repairing damage on the surface of a damaged dielectric film 406. The film includes a silanol terminus 416. The presence of the silanol terminus 416 increases the dielectric constant k of the film 406. In accordance with methods described herein, a photosensitive organic compound 408 (here, ethynyltrimethylsilane) is activated by exposing it to UV radiation. The UV photon activates the photosensitive organic compound 408 to form the activated species 418 (here, ethyltrimethylsilane). The activated species 418 reacts with the silanol terminus 416 to form a Si—O—Si bond connecting the silicon group 426a originally bonded to the dielectric film 406 with the trimethylsilicon group 426b, while ethane 422 is released in the reaction. Ethane 422 may then be pumped from a process chamber to be removed. This represents an example of the repair process where the presence of the Si—(CH$_3$)$_3$ trimethylsilane compound now attached to the dielectric film 406 helps lower the dielectric constant k.

Figure 5:
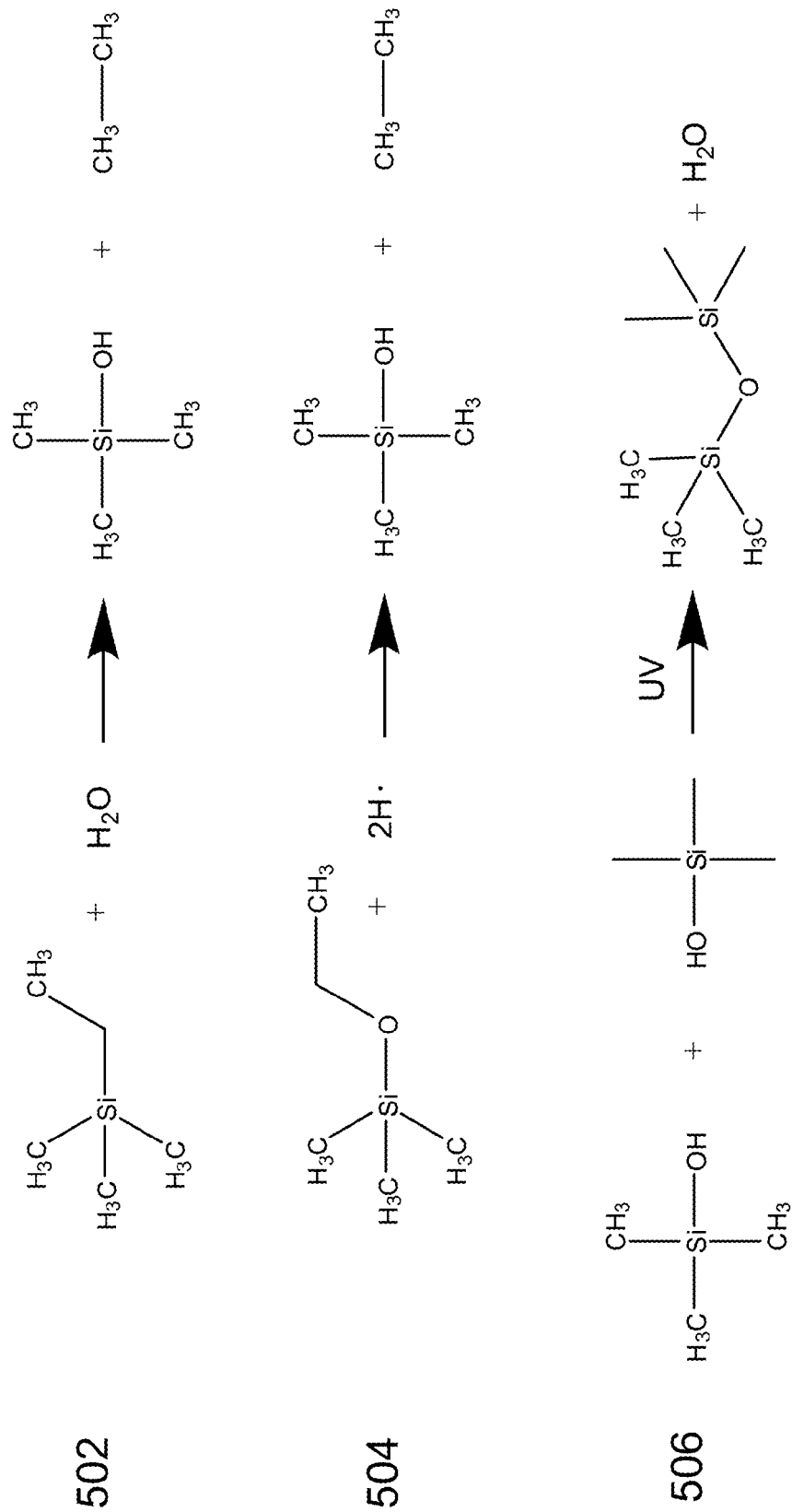
FIG. 5 depicts example reactions of mechanisms for forming and using compounds in accordance with disclosed embodiments.

In some embodiments, a silicon-containing compound with an alcohol end group may be used as the photosensitive organic compound. These compounds may be formed by a hydrolysis reaction using an organosilane. FIG. 5 provides an example mechanism scheme for forming these photosensitive silicon-containing compounds with alcohols and for using these to repair low-k films. Reaction 502 depicts ethyltrimethylsilane as a precursor for forming a photosensitive compound via a hydrolysis reaction. Ethyltrimethylsilane reacts with water to form trimethylsilanol and ethane. In another embodiment, in reaction 504, ethoxytrimethylsilane reacts with hydrogen radicals to form trimethylsilanol and ethane. In some embodiments, the organic compound may react with hydrogen radicals, ions, or both. In some embodiments, the silanol compound to be used as a photosensitive organic compound in accordance with various embodiments may be formed in a remote intermediate reaction vessel to avoid any interaction with the low-k dielectric film. Note that various compounds may be used instead of ethyltrimethylsilane, and compounds formed may include more than one Si—OH bond. For example, compounds that may be used to form photosensitive silanols include alkylsilanes and alkoxysilanes. Specific examples include trimethylsilane, tetramethylsilane, tetramethoxysilane, tetraethylsilane, tetraethoxysilane, trimethylethoxsilane, n-propyltriethoxysilane, and combinations thereof:

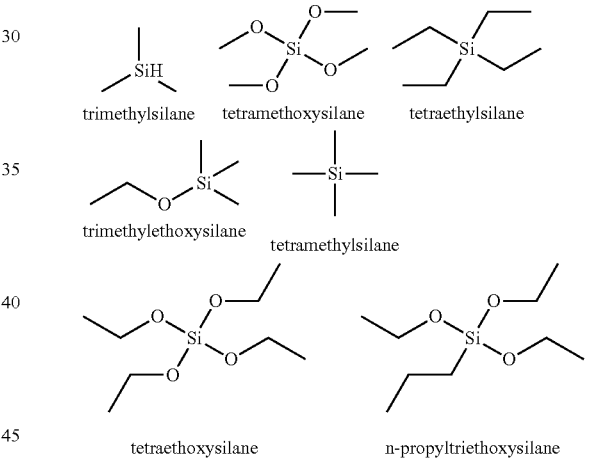

In this particular example, in reaction 506, an activated trimethylsilanol reacts with a Si—OH terminal on a damaged dielectric film and may form a Si—O—Si bond to repair the film, and water which may be pumped out or eliminated using the UV radiation.

An alternative mechanism for k recovery is methylation. In methylation, the methylation agent may be incorporated into the film such that carbons are added to the film. For example, a silanol group on a damaged dielectric film may react such that the —OH group leaves and methyl groups —CH$_3$ or other carbon groups bind to the silicon. The above described silicon-containing compounds may also be used for methylation such that a carbon chain reacts with one or more —OH groups on the damaged dielectric film to form a Si—C bond. The incorporation of carbons reduce the dielectric constant.

Pore Sealing

Processes provided herein may be suitable for pore sealing of a porous low-k film, particularly in back end of line (BEOL) processing of semiconductor devices. Sealing the porous dielectric refers to preventing diffusion or penetration of metal atoms into the porous dielectric. Smaller species (e.g., H radicals) may be able to penetrate a sealed pore, however. In pore sealing, the photosensitive organic compound may be selected depending on the size of the pores to be sealed. Pore sealing is particularly helpful to form a smooth surface on the dielectric film for subsequent processing. The processes may also be helpful to prevent any subsequent chemistry from entering pores in the substrate and causing any damage or filling the pores.

In various embodiments, a large photosensitive organic compound is selected for use in the methods described above with respect to FIGS. 2, 3A, and 3B. In some embodiments, the size of the photosensitive organic compound may be chosen in accordance with a desired dielectric constant. The photosensitive organic compound should be larger than the effective pore diameter of pores to be sealed. Generally, the lower the dielectric constant, the larger the effective pore diameter. As noted above, the effective pore diameter is defined as the maximum diameter of a porogen that can pass through a pore in a dielectric film. A large photosensitive organic compound may be used to seal pores. As used herein, the term "large compound" refers to a compound having a diameter greater than about 1 nm. In some embodiments, such a compound may have a diameter greater than about 1.5 nm, or greater than about 2.0 nm. A compound diameter is defined the longest distance from one end of the molecule to the other end for a given photosensitive organic compound. For compounds that may have more than conformation, the diameter of the smallest conformation may be considered to be the compound diameter. In some embodiments, large compounds may be formed by polymerizing smaller organic compounds, such as ethylene compounds or alkynes. In some embodiments, the polymerization of smaller organic compounds to form a large photosensitive organic compound may be performed in a separate chamber from the process chamber where the substrate is housed. In various embodiments, a compound with multiple end groups that are highly reactive with each other once activated may be used. Examples of end groups include vinyls and epoxies. For example, upon activation, compounds with vinyl or epoxy end groups may form a polymer of increasing molecular weight, the resulting compound of which may then be used in some embodiments.

Example effective pore diameters for predicted dielectric constants in accordance with simulated data as described below are depicted in Table 1. As an example, in selecting large photosensitive organic compounds, a compound may be selected such that the diameter of the compound is greater than a 1.4 nm effective pore diameter, so as to result in a dielectric film having a predicted dielectric constant of 2.30.

TABLE 1

| Effective Pore Diameter and Dielectric Constants | |
| --- | --- |
| Effective Pore Diameter (nm) | Predicted Dielectric Constant (k-value) |
| 0.2 | 2.80 |
| 0.4 | 2.68 |
| 0.6 | 2.58 |
| 0.8 | 2.49 |
| 1.0 | 2.40 |
| 1.2 | 2.35 |
| 1.4 | 2.30 |
| 1.6 | 2.25 |
| 1.8 | 2.20 |

TABLE 1-continued

| Effective Pore Diameter and Dielectric Constants | |
| --- | --- |
| Effective Pore Diameter (nm) | Predicted Dielectric Constant (k-value) |
| 2.0 | 2.16 |
| 2.2 | 2.12 |
| 2.4 | 2.08 |

The simulated data compares effective pore diameters and dielectric constants. Experimental results from two data points having a specific effective pore diameter and dielectric constant, as well as simulated results using a correlation model were used to approximate a predicted dielectric constant as a function of effective pore diameter. The model showed a decreasing approximately exponential relationship such that as effective pore diameter increased, the predicted dielectric constant decreased. Generally, low-k films were modeled as having a larger effective pore diameter, consistent with the relationship with porosity and dielectric constants. The model showed that films having an effective pore diameter greater than about 1.0 nm were predicted to have a dielectric constant of less than about 2.4. A few points of the predicted dielectric constant and effective pore diameters are provided in Table 1. The results suggest that a compound selected for pore sealing in accordance with disclosed embodiments should have a diameter greater than about 1.0 nm to yield a dielectric film having a sufficiently low dielectric constant. Thus, while pores are sealed using these larger compounds, the dielectric constant may be maintained or reduced to a desired dielectric constant.

As an example, tetramethylsilane has a diameter of about 0.5 nm, but such a compound used in pore sealing would only seal pores with an effective pore diameter of less than about 0.5 nm. In pores having an effective pore diameter greater than 0.5 nm, tetramethylsilane would enter the pores and could fill the pore instead of sealing it. In contrast, tetravinyltetramethylcyclotetrasiloxane (TVTMCTS) has a diameter of about 1.0 nm, which would be large enough to seal pores with an effective pore diameter of less than about 1.0 nm. Thus, after a pore sealing process using TVTMCTS in accordance with disclosed embodiments, the dielectric film would have sealed pores with the maximum sized pores being at most about 1.0 nm, which would, based on the model in this experiment, yield a film having a dielectric constant less than about 2.4.

In some embodiments, the photosensitive organic compound selected for pore sealing is at least bifunctional, i.e., the photosensitive organic compound has at least two functional groups that are photosensitive. Photosensitive groups may include alkenes, alkynes, aryls, alcohols, alkoxides, and cyclic structures as described above. In some embodiments, the photosensitive group may be a non-vinyl aryl structure, a non-aromatic cyclic structure, or an alcohol. Example compounds include tetravinyltetramethylcyclotetrasiloxane (TVTMCTS), vinyltris(trimethylsiloxy)silane, 1,1,2,2-tetramethyl-1,2-divinyldisilane, 1,3-divinyltetramethyldisiloxane, and tri-tert-butoxy(vinyl)silane, the structures of which are previously depicted above. Use of a large photosensitive organic compound with at least two photosensitive functional groups in pore sealing may homogenize the distribution of pore sizes in a dielectric film, and may reduce the dielectric constant.

Without being bound by any particular theory, it is believed that large photosensitive organic compounds may form Si—O—Si bonds with terminals on the dielectric film around an unsealed pore, such that once the Si—O—Si bonds are formed, the pore is sealed by the photosensitive organic compounds large enough to span the diameter of these pores. The Si—O—Si bonds may be formed by reacting the photosensitive groups with terminal groups on the dielectric film. Large photosensitive organic compounds are of particular interest because smaller organic compounds that have a diameter smaller than a pore in the film may enter the pore and fill the pore instead of sealing it. FIG. 6A provides a schematic illustration of a feature 680 of a dielectric film 606 on a substrate 600. On the sidewall of the feature, there may be various pores 664 in the film itself, while some of these pores may be unsealed pores 654. Pores may have been unsealed after a patterning process or planarization process. Although the figure depicts unsealed pores 654 on the sidewall of a feature 680, note unsealed pores may exist on other surfaces of the dielectric film.

A low-k dielectric film 606 having unsealed pores 654 as shown in 606-1 may be exposed to an activated species form by exposing a large photosensitive compound to UV radiation, such as in accordance with the methods described above with respect to FIGS. 2, 3A, and 3B. The large molecules may span the diameters of the unsealed pores 654 to form a film of dielectric material 616 over the pores 654 as shown in 606-2. The dielectric material formed over the pores may, in some embodiments, partially fill the pore such that about 1 to 3 monolayers of dielectric is penetrated at the pore opening, or about 1 nm or less of dielectric is penetrated at the pore opening. In various embodiments, the size of the large photosensitive organic compound is chosen by selecting a molecule having a diameter greater than the effective pore diameter on the dielectric film.

Figure 6B:
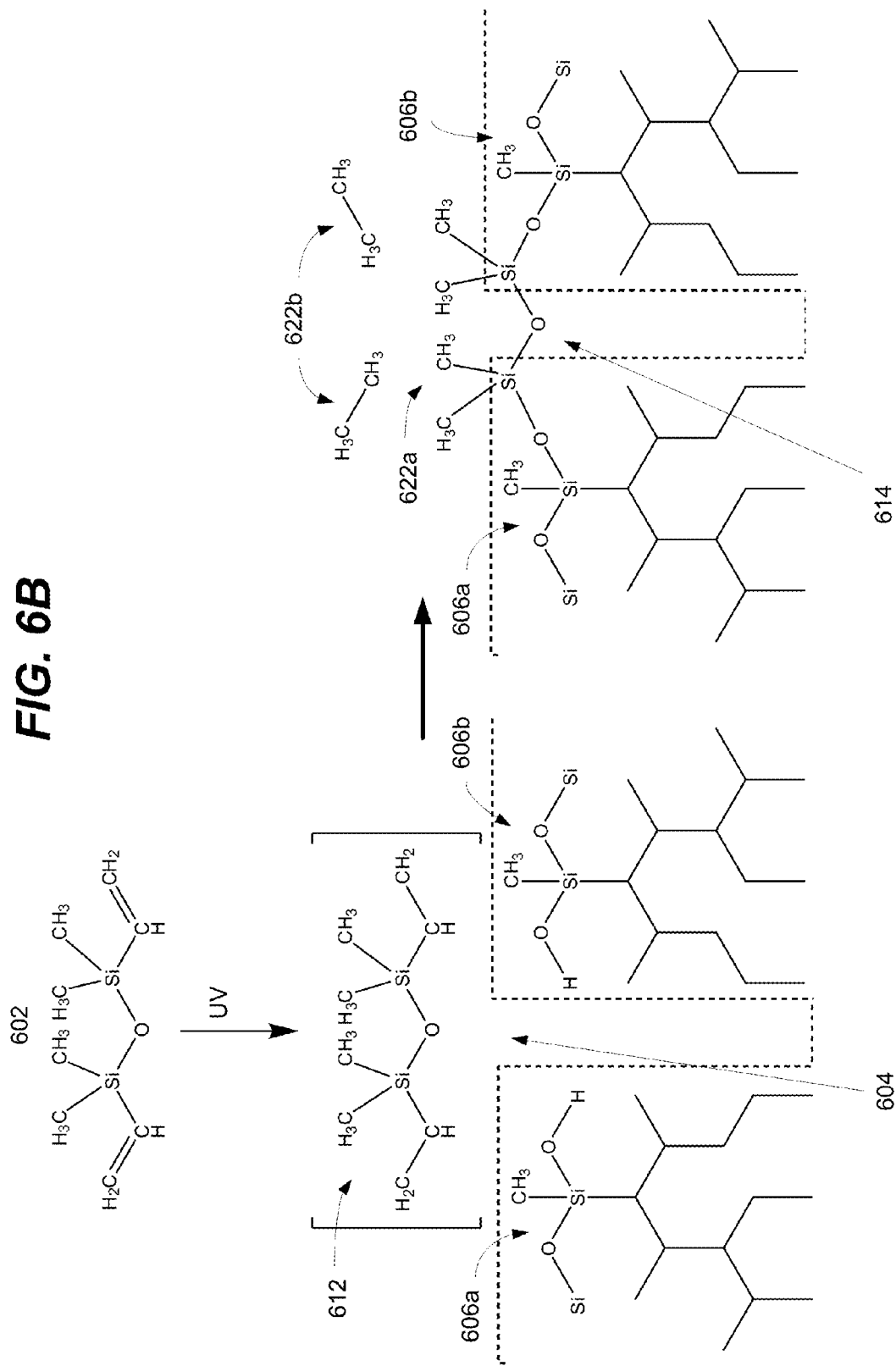
FIG. 6B is an example schematic diagram of a mechanism for sealing pores in accordance with disclosed embodiments.

FIG. 6B depicts an example of the chemical interaction at the opening of a pore to be sealed in accordance with various embodiments. In the example provided, the large photosensitive organic compound (here, 1,3-divinyltetramethyldisiloxane) 602 is exposed to UV to form an activated species 612, which may have single bonds where the photosensitive organic compound 602 had double bonds. The UV radiation activated these double bonds to form single bonds, increasing the reactivity of the compound. A substrate with a pore 604 having Si—OH terminals 606a and 606b near the opening of the pore 604 may be exposed to the activated species 612. Molecules of the activated species 612 may undergo a reaction with the Si—OH terminals 606a and 606b to form a Si—O—Si bond linking terminals 606a and 606b to form a seal 622a over the now sealed pore 614. The reaction may release ethane 622b which may be pumped out of a process chamber. In some embodiments, a compound with a large number of vinyl groups may be used such that some vinyl groups bond to the surface of the substrate, while others bond to other molecules near the surface, thereby forming a mesh across the surface. In embodiments where the compound includes a cyclic structure, the formation of bonds may occur with the ring closed or opened, which may lead to different mesh geometries. In some embodiments, the mesh may be isolated to regions of mesoporosity at or near the surface of the substrate.

Mechanical Reinforcement

Highly porous ULK or ELK films may have a weak matrix. Mechanical reinforcement of such films may help increase the strength of the matrix by increasing the density of the bonding and decreasing the mesoporosity. However, as a result, the free-volume with the material may decrease, which may increase the dielectric constant. In some embodiments, the mechanically reinforced layer on the matrix may be removed in subsequent processing or may be incorporated in a film subsequently deposited on the dielectric film. In some embodiments, the mechanically reinforced layer is removed by exposure to a plasma, a reactive UV treatment that may be reducing or oxidizing, or a thermal treatment depending on the compound used to mechanically reinforce the matrix. For example, if an organic polymer is used, an oxidizing or reducing plasma, or a reactive UV treatment may be used.

In some embodiments, the layer is maintained on the dielectric film, and the benefit of the strengthened film outweighs the increase in dielectric constant. The film may be strengthened to enhance the mechanical strength, increase damage resistance, and improve etch rate. Molecules suitable for use in accordance with methods described above in FIGS. 2, 3A, and 3B for application in mechanical reinforcement of films include molecules with two or more photosensitive end groups. The compounds may be smaller than the effective pore diameter such that the molecules may enter the pores and mechanically reinforce the surface of the dielectric film within the pores. Example molecules suitable for use in mechanical reinforcement include allyltrimethylsilane, diallyldimethylsilane, dimethyldivinylsilane, trimethyl(vinyl)silane, ethynyltrimethylsilane, and, depending on the effective pore diameter, possibly 1,1,3,3-tetramethyl-1,3-disiletane, 1,1-dimethylsiletane, 1,1-dimethylsilinane, and trimethyl(phenyl)silane.

In some embodiments, a purely organic compound may be exposed to UV radiation to drive a condensation reaction between the alcohol and Si—OH sites. Example compounds include divinylether, propylene glycol, and ethylene glycol:

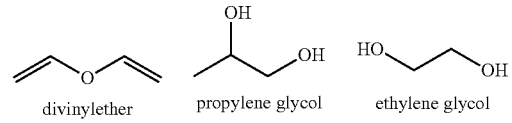

divinylether   propylene glycol   ethylene glycol

Without being bound by any particular theory, it is believed that photosensitive organic compounds with at least two photosensitive functional groups may form many Si—O—Si bonds with terminals on the surface of the porous low-k film. These compounds may also penetrate into the porous low-k film to increase cross-linking within the matrix. The Si—O—Si bonds may be formed by reacting activated the photosensitive groups with the terminal groups in the porous film. Photosensitive organic compounds smaller than the effective pore diameter of a film are of particular interest because smaller organic compounds may be capable of entering pores or penetrating into the film to increase cross-linking.

Apparatus

In some embodiments, the apparatus will include one or more chambers (sometimes referred to as process modules) that house one or more wafers and are suitable for wafer processing. At least one chamber will include an ultraviolet (UV) source. A single chamber may have one or more stations and may be employed for one, some or all operations of the disclosed embodiments. Each chamber may house one or more wafers or substrates for processing. The one or more chambers maintain the wafer in a defined position or positions (with or without motion within that position, e.g., rotation, vibration, or other agitation) during procedures of the disclosed embodiments. For certain operations in which the wafer temperature is to be controlled, the apparatus may include a controlled temperature wafer support, which may be heated, cooled, or both. The wafer support may also be controllable to provide the defined wafer positions within a process module. The wafer support may rotate, vibrate, or otherwise agitate the wafer relative to the UV source.

Figure 7:
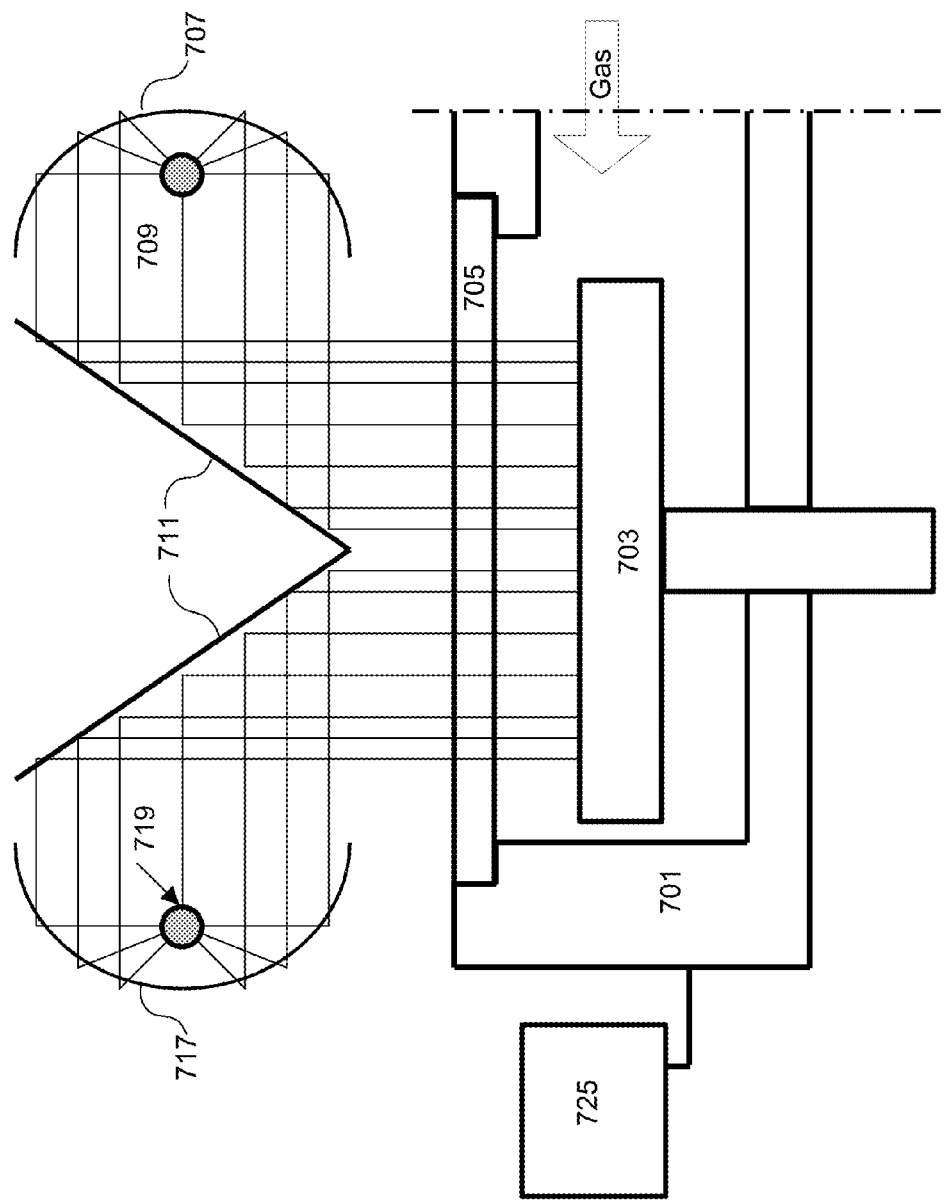
FIG. 7 is a schematic diagram of a process chamber for performing methods in accordance with disclosed embodiments.

FIG. 7 depicts the arrangement of a UV light source suitable for implementation of the disclosed embodiments. In this embodiment, a cold mirror reflector seeks to diminish the incidence of IR radiation on the wafer, while permitting UV radiation to be available for processing. For clarity, this figure depicts only one of the possible multiple processing stations available in an apparatus of disclosed embodiments. Also, this figure omits depiction of the wafer for purposes of clarity, and shows a flood-type reflector. It will be apparent to those skilled in this art that the principles depicted in FIG. 7 may also be applied to a focused reflector. In some embodiments, the chamber in FIG. 7 is used as a remote chamber for activating a photosensitive organic compound, and the activated species is then transferred from this chamber to another chamber in the apparatus, where the substrate is housed in the other chamber. The apparatus also includes a source of a photosensitive organic compound 720, such as an unsaturated alkyl silane or compound with high ring strain as described above.

Referring to FIG. 7, pedestal 703 is embedded into one station of a processing chamber 701. Window 705 is located appropriately above pedestal 703 to permit radiation of the wafer (not shown) with UV output of the desired wavelengths from UV lamps 709 and 719. Suitable lamps for the UV light source may include, but are not limited to, mercury vapor, D or V bulb lamps, with or without filters, as described above. In this embodiment, both lamps 709 and 719 are equipped with reflectors 707 and 717 which render their output into flood illumination. Reflectors 707 and 717 may themselves be made from "cold mirror" materials, i.e., they may also be designed to transmit IR and reflect UV radiation.

Radiation emanating directly from lamps 709 and 719 as well as that reflected from reflectors 707 and 717 is further incident upon a set of reflectors 711. These reflectors are also cold mirrors designed to reflect only those UV wavelengths that are desired for the purposes of curing the film on the wafer. All other radiation including visible and most particularly the IR is transmitted by this set of cold mirrors. Therefore the UV wavelengths are preferentially transmitted to the film. It will be apparent to those skilled in this art that the specific angle, distance, and orientation of the cold mirror reflectors 711 with respect to the lamps 709 and 719 may be optimized to maximize the UV intensity incident on the wafer and to optimize the uniformity of its illumination.

The chamber 701 is capable of holding a vacuum and/or containing gases at pressures above atmospheric pressure. For simplicity, only one station of one chamber 701 is shown. It is noted that in some embodiments, chamber 701 is one chamber in a multi-chambered apparatus, although chamber 701 could alternatively be part of a stand-alone single chambered apparatus. In either case, the chamber(s) may have one or more than one station. In some embodiments, the UV process modules have one station. Suitable apparatus for implementation of the disclosed embodiments may include configurations as described herein of INOVA, Sequel, Vector, and SOLA systems from Lam Research in Fremont, Calif. In a particular example, the disclosed embodiments may be implemented on a Vector Extreme tool from Lam Research in Fremont, Calif.

Note that the UV light source configuration of FIG. 7 is only an example of a suitable configuration. In general, it is preferable that the lamps are arranged to provide uniform UV radiation to the wafer. For example, other suitable lamp arrangements can include arrays of circular lamps concentrically or otherwise arranged, or lamps of smaller length arranged at 90 degree and 180 degree angles with respect to each other may be used. The light source(s) can be fixed or movable so as to provide light in appropriate locations on the wafer. Alternatively, an optical system, including for example a series of movable lenses, filters, and/or mirrors, can be controlled to direct light from different sources to the substrate at different times.

The UV light intensity can be directly controlled by the type of light source and by the power applied to the light source or array of light sources. Factors influencing the intensity of applied power include, for example, the number or light sources (e.g., in an array of light sources) and the light source types (e.g., lamp type or laser type). Other methods of controlling the UV light intensity on the wafer sample include using filters that can block portions of light from reaching the wafer sample. For example, filters may be used to select wavelengths for activating a selected photosensitive organic compound. As with the direction of light, the intensity of light at the wafer can be modulated using various optical components such as mirrors, lenses, diffusers, and filters. The spectral distribution of individual sources can be controlled by the choice of sources (e.g., mercury vapor lamp (H or H+ bulb), xenon lamp, deuterium lamp, iron filled ("D") bulb, gallium filled ("V") bulb, excimer laser etc.) as well as the use of filters that tailor the spectral distribution.

In certain embodiments, a system controller 725 is employed to control process conditions during the UV treatment processes in accordance with the disclosed embodiments. The controller 725 will typically include one or more memory devices and one or more processors. The processor may include a CPU or computer, analog, and/or digital input/output connections, stepper motor controller boards, etc. Signals for monitoring the process may be provided by analog and/or digital input connections of the system controller 725. The signals for controlling the process are output on the analog and digital output connections of the deposition apparatus.

In some implementations, a controller 725 is part of a system, which may be part of the above-described examples. Such systems can include semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller 725, depending on the processing requirements and/or the type of system, may be programmed to control any of the processes disclosed herein, including the delivery of a photosensitive organic compound and ultraviolet radiation settings, including power, intensity, and exposure times. In an integrated tool, the controller 725 may also control processes such as processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller 725 may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). The system software may be designed or configured in many different ways. For example, various chamber component subroutines or control objects may be written to control operation of the chamber components necessary to carry out the inventive processes. Examples of programs or sections of programs for this purpose include substrate positioning code, photosensitive organic compound control code, pressure control code, heater control code, and UV radiation control code. In one embodiment, the controller 725 includes instructions for performing processes of the disclosed embodiments according to methods described above. The computer program code for controlling the processes can be written in any conventional computer readable programming language: for example, assembly language, C, C++, Pascal, Fortran, or others. Compiled object code or script is executed by the processor to perform the tasks identified in the program.

Program instructions may be instructions communicated to the controller 725 in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller 725, in some implementations, may be a part of or coupled to a computer that is integrated with, coupled to the system, otherwise networked to the system, or a combination thereof. For example, the controller 725 may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller 725 receives instructions in the form of data, which specify parameters for each of the processing steps to be performed during one or more operations. It should be understood that the parameters may be specific to the type of process to be performed and the type of tool that the controller 725 is configured to interface with or control. Thus as described above, the controller 725 may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller 725 might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory. There may be a user interface associated with controller 725. The user interface may include a display screen, graphical software displays of the apparatus and/or process conditions, and user input devices such as pointing devices, keyboards, touch screens, microphones, etc.

It should be understood that the apparatus depicted in FIG. 7 is only an example of a suitable UV process module and that other designs may be used. The semiconductor device should be transferred from the UV module to the barrier layer deposition module without an air break. This may be accomplished on multiple of single tools.

EXPERIMENTAL

Experiment 1

Figure 8:
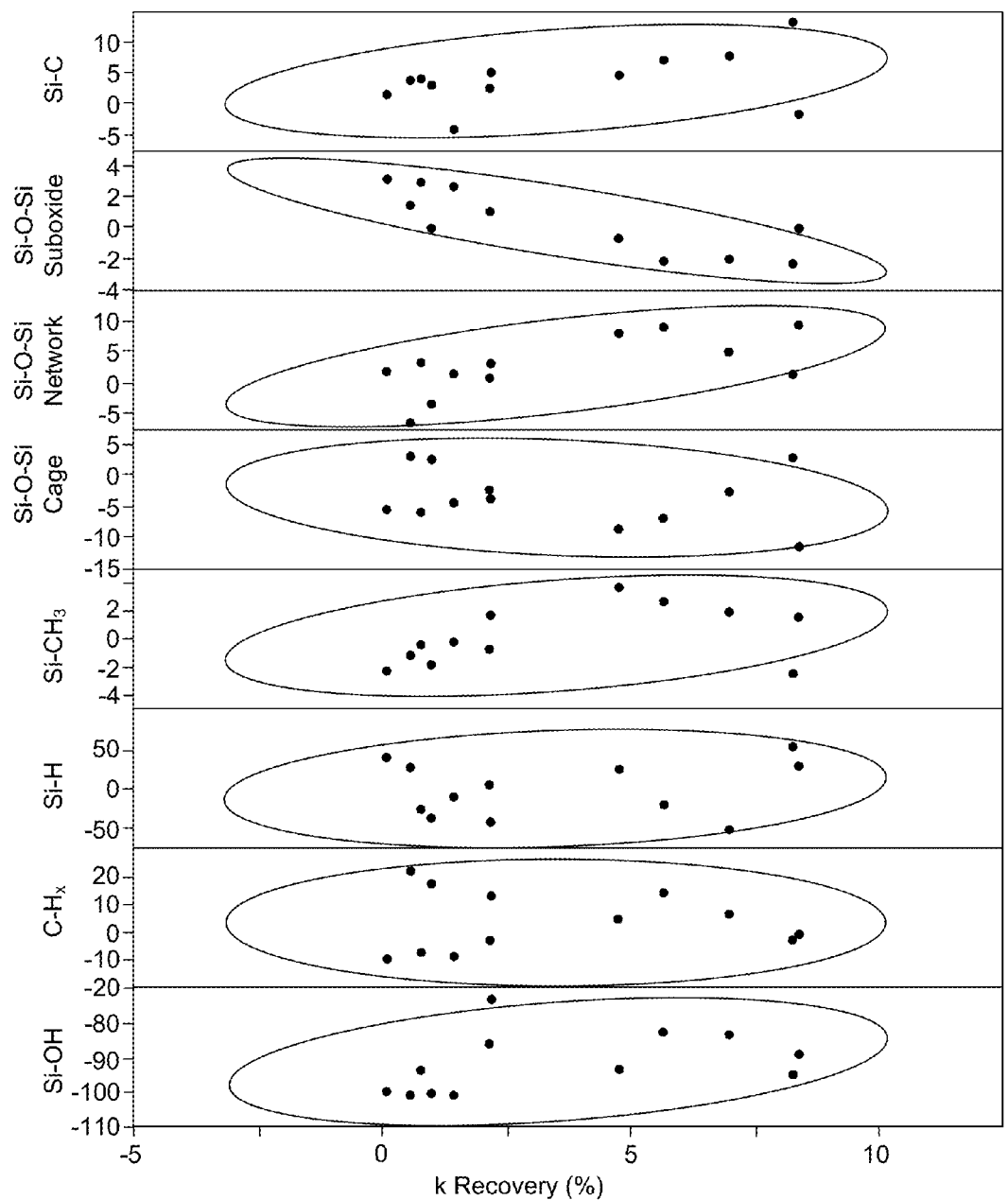
FIG. 8 is a plot depicting experimental results for k recovery and FTIR spectra.

An experiment was conducted to compare trends between percent k recovery and different groups on the dielectric film as measured by Fourier Transform Infrared (FTIR). A ULK thin film with a post-cure dielectric constant of about 2.5 was damaged after an ash process. The damaged film had a dielectric constant of about 2.8. The film was repaired in accordance with disclosed embodiments using trimethylvinylsilane. Trimethylvinylsilane was activated by UV radiation for about 2 minutes to form the activated species and the damaged ULK thin film was exposed to the activated species. The film was evaluated by FTIR and the k recovery was measured. The results are depicted in FIG. 8, which shows the measured percent change in infrared absorption feature area versus recovered dielectric constant.

The infrared absorption was quantified through measurements using FTIR spectroscopy. A linear baseline was removed from the regions: 650 $cm^{-1}$ to 950 $cm^{-1}$, 950 $cm^{-1}$ to 1300 $cm^{-1}$, 2050 $cm^{-1}$ to 2350 $cm^{-1}$, 2825 $cm^{-1}$ to 3075 $cm^{-1}$, and 3250 $cm^{-1}$ to 3950 $cm^{-1}$, to extract the data for the Si—C, Si—O—Si, Si—CH3, Si—H, C—$H_x$, and Si—O—H features respectively. A series of discrete Gaussians were fit to each region using peak positions derived from the literature including: 724 $cm^{-1}$, 776 $cm^{-1}$, 803 $cm^{-1}$, 836 $cm^{-1}$, 865 $cm^{-1}$, 895 $cm^{-1}$, 1035 $cm^{-1}$, 1060 $cm^{-1}$, 1140 $cm^{-1}$, 1275 $cm^{-1}$, 2180 $cm^{-1}$, 2240 $cm^{-1}$, 2880 $cm^{-1}$, 2916 cm$^{-1}$, 2968 cm$^{-1}$, 3000 cm$^{-1}$, 3500 cm$^{-1}$, and 3750 cm$^{-1}$. The percent k recovery in this case was computed using the formula:

$$\% \, k \text{ recovery} = 100 \times \frac{k_{damaged} - k_{recovery}}{k_{cure}}$$

where $k_{damaged}$, $k_{recovery}$, $k_{cure}$ are the dielectric constant of the ULK thin film after damage, recovery, and cure respectively. Trends showed that a higher percentage k recovery had higher Si—O—Si network, lower Si—O—Si suboxide, lower Si—O—Si cage, and higher Si—CH$_3$.

CONCLUSION

Although the foregoing embodiments have been described in some detail for purposes of clarity of understanding, it will be apparent that certain changes and modifications may be practiced within the scope of the appended claims. It should be noted that there are many alternative ways of implementing the processes, systems, and apparatus of the present embodiments. Accordingly, the present embodiments are to be considered as illustrative and not restrictive, and the embodiments are not to be limited to the details given herein.

What is claimed is:

1. A method of sealing pores in a low-k dielectric substrate, the method comprising:
   exposing a photosensitive organic compound to ultraviolet radiation to form an activated species, and
   after forming the activated species, exposing the substrate to the activated species to thereby seal pores,
wherein the diameter of the photosensitive organic compound is greater than about 1 nm.

2. The method of claim 1, wherein the diameter of the organic compound is greater than about 1.5 nm.

3. The method of claim 1, wherein the diameter of the organic compound is greater than about 2 nm.

4. The method of claim 1, wherein the diameter of the organic compound is greater than the effective pore diameter of the low-k dielectric.

5. The method of claim 1, wherein the organic compound is activated at a wavelength greater than about 200 nm.

6. The method of claim 1, wherein the organic compound has at least two photosensitive groups.

7. The method of claim 6, wherein the photosensitive groups are selected from the group consisting of alkenes, alkynes, aryls, alcohols, alkoxides, and cyclic structures.

8. The method of claim 1, wherein the substrate is exposed to the activated species at a temperature of between about 25° C. to about 450° C.

9. A method of mechanically reinforcing a low-k dielectric substrate, the method comprising:
   exposing a photosensitive organic compound to ultraviolet radiation to form an activated species, and
   after forming the activated species, exposing the substrate to the activated species,
wherein the organic compound comprises at least two photosensitive groups, and
wherein exposing the substrate to the activated species increases silicon-oxide cross-linking in the dielectric substrate.

10. The method of claim 9, wherein the photosensitive groups are selected from the group consisting of alkenes, alkynes, aryls, alcohols, alkoxides, and cyclic structures.

11. The method of claim 9, wherein the photosensitive organic compound further comprises at least two silicon atoms.

12. The method of claim 9, wherein the photosensitive organic compound is activated at a wavelength greater than about 200 nm.

13. The method of claim 9, wherein the photosensitive organic compound has a diameter less than an effective pore diameter of the low-k dielectric substrate.

14. A method of repairing damage in a low-k dielectric substrate, the method comprising:
   exposing a photosensitive organic compound to ultraviolet radiation to form an activated species, and
   after forming the activated species, exposing the substrate to the activated species,
wherein the photosensitive organic compound is selected from the group consisting of non-vinyl aryls, non-aromatic cyclic structures, and alcohols, and
wherein low-k dielectric damage in the substrate is repaired.

15. The method of claim 14, wherein the photosensitive organic compound is an alcohol formed by reacting an organosilane with a reducing agent via a hydrolysis mechanism.

16. The method of claim 14, wherein the photosensitive organic compound is an alcohol formed by reacting an alkoxysilane with a reducing agent via a hydrolysis mechanism.

* * * * *